(12) United States Patent
Inoue et al.

(10) Patent No.: US 9,252,289 B2
(45) Date of Patent: Feb. 2, 2016

(54) NON-VOLATILE SEMICONDUCTOR MEMORY DEVICE

(71) Applicant: Seiko Instruments Inc., Chiba (JP)

(72) Inventors: Ayako Inoue, Chiba (JP); Kazuhiro Tsumura, Chiba (JP)

(73) Assignee: SEIKO INSTRUMENTS INC. (JP)

( * ) Notice: Subject to any disclaimer, the term of this patent is extended or adjusted under 35 U.S.C. 154(b) by 144 days.

(21) Appl. No.: 13/743,485

(22) Filed: Jan. 17, 2013

(65) Prior Publication Data
US 2013/0187216 A1 Jul. 25, 2013

(30) Foreign Application Priority Data
Jan. 25, 2012 (JP) ................................ 2012-012993

(51) Int. Cl.
| | | |
|---|---|---|
| H01L 21/335 | (2006.01) | |
| H01L 21/8232 | (2006.01) | |
| H01L 29/788 | (2006.01) | |
| H01L 49/02 | (2006.01) | |
| G11C 16/04 | (2006.01) | |

(52) U.S. Cl.
CPC .......... H01L 29/788 (2013.01); G11C 16/0408 (2013.01); H01L 28/20 (2013.01); H01L 29/7884 (2013.01)

(58) Field of Classification Search
USPC ............... 438/3, 48, 104, 197, 240, 382, 689; 257/2, 4, 314, 316, E21.409, E29.3, 257/E45.003
See application file for complete search history.

(56) References Cited

U.S. PATENT DOCUMENTS

| | | | |
|---|---|---|---|
| 5,646,885 A * | 7/1997 | Matsuo et al. | 365/185.05 |
| 5,869,873 A * | 2/1999 | Yu | 257/362 |
| 2005/0104617 A1* | 5/2005 | Abe | 326/26 |
| 2010/0329016 A1* | 12/2010 | Taniguchi | 365/185.18 |

FOREIGN PATENT DOCUMENTS

JP 2001257324 9/2001

* cited by examiner

Primary Examiner — Charles Garber
Assistant Examiner — Abdulfattah Mustapha
(74) Attorney, Agent, or Firm — Adams & Wilks

(57) ABSTRACT

A non-volatile semiconductor memory device has a semiconductor substrate, an element isolation region disposed in a surface of the semiconductor substrate, a well region disposed along one principal surface of the semiconductor substrate, source and drain regions arranged in the well region, a gate oxide film arranged on the surface of the semiconductor substrate between the source region and the drain region, a floating gate disposed on the gate oxide film, and an insulating film disposed on a surface of the floating gate. A control gate is capacitively coupled to the floating gate disposed through intermediation of the insulating film. A resistive element is serially connected to the control gate. Write characteristics of the non-volatile semiconductor memory device are improved as a result of a delay effect of the resistive element serially connected to the control gate.

14 Claims, 6 Drawing Sheets

PRIOR ART

FIG. 3

PRIOR ART

NON-VOLATILE SEMICONDUCTOR MEMORY DEVICE

BACKGROUND OF THE INVENTION

1. Field of the Invention

The present invention relates to a P-channel non-volatile semiconductor memory device capable of electrical writing and reading.

2. Description of the Related Art

In recent years, there is known a semiconductor integrated circuit including a bleeder resistor circuit capable of being trimmed by a memory. Conventionally, the bleeder resistance is adjusted by a method of mechanically cutting a fuse formed in parallel to the bleeder resistor with the use of laser light or the like.

The trimming of the bleeder resistor can therefore be performed only before the package assembly. The use of a semiconductor memory for trimming the bleeder resistor, on the other hand, enables electrical trimming even after the assembly. The following two typical benefits are obtained.
1. Quick delivery can be obtained because trimming is carried out in the packaged state before shipment.
2. High precision can be achieved because trimming covers package shift that occurs during package assembly.

In general, once the bleeder resistor is trimmed, there is no need to rewrite information. Accordingly as a memory for trimming, an ultraviolet-light-erasable programmable read only memory (EPROM) is used as a one-time programmable (OTP) memory. Further, unlike a memory IC, the memory for trimming the bleeder resistor requires small memory capacity. As compared to the memory IC, high integration and high-speed operation of a memory cell are not required. Consequently, the typical challenges required for the memory for trimming include downsizing a peripheral circuit for controlling the memory, achieving lower voltage operation, and utilizing the existing manufacturing process.

As a conventional ultraviolet-light-erasable EPROM, a non-volatile EPROM for writing information with the use of hot carriers is known.

At present, the mainstream of the non-volatile memory for writing information with the use of hot carriers is an N-channel non-volatile EPROM. One of the reasons is that the N-channel non-volatile EPROM has a higher operating speed than a P-channel EPROM.

However, as described above, the memory for trimming the bleeder resistor has small capacity and is not required to rewrite information once the information is written in trimming, and hence there is no problem even if the operating speed is lower than that of the memory IC. Further, in the P-channel EPROM, without applying such a high potential that causes avalanche breakdown between the substrate and the drain, drain avalanche hot electrons (DAHEs) are generated by applying a relatively low voltage and are injected into a floating gate, to thereby change a threshold voltage and perform writing. Thus, it is considered that the P-channel non-volatile EPROM is suitable for the memory for trimming the bleeder resistor.

The structure of a conventional P-channel non-volatile EPROM for writing information with the use of hot carriers is described below with reference to a cross-sectional view illustrated in FIG. 3.

Figure 3:
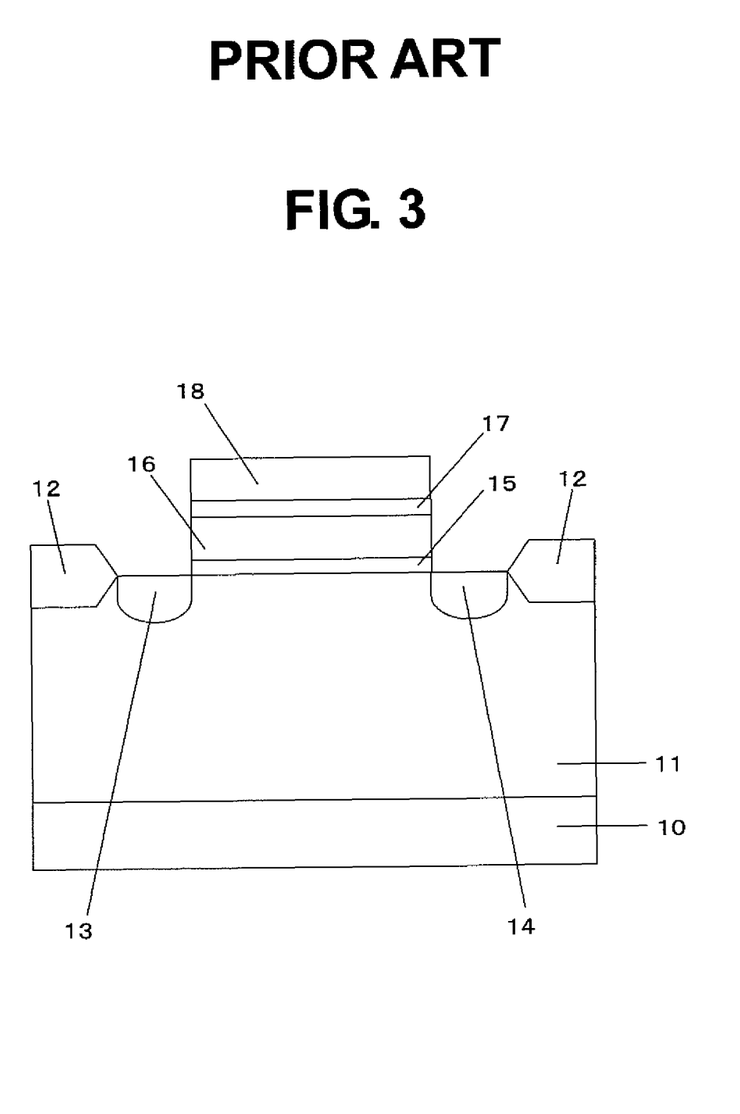
FIG. 3 is a cross-sectional view illustrating a schematic structure of a conventional non-volatile EPROM.

In FIG. 3, an N-type well 11 is formed along one principal surface of a P-type semiconductor substrate 10 in which element isolation regions 12 are selectively formed. Impurities having P-type conductivity are heavily diffused in the N-type well 11, thereby forming a source region 13 and a drain region 14. On a gate oxide film 15, a floating gate 16 is formed above the substrate in which the source region 13 and the drain region 14 are formed.

A control gate 18 is formed above the floating gate 16 through the intermediation of a second insulating film 17, thereby constituting a conventional non-volatile EPROM.

The structure of electrode wiring and other members in subsequent processes (metal wiring and protective film) is similar to that of a general semiconductor device. The detailed description thereof is therefore omitted.

Next, a method of operating the conventional P-channel non-volatile EPROM is described.

In writing data, a voltage is applied between the source and the drain and to the control gate so as to generate hot carriers, and hot electrons are injected into the floating gate, to thereby fluctuate a threshold voltage. Data before and after the threshold voltage fluctuation is associated with "0" or "1".

In reading data, a potential is applied between the source and the drain, and a current corresponding to a threshold which differs depending on the presence or absence of writing is monitored, to thereby perform determination of "0" or "1".

Figure 4:
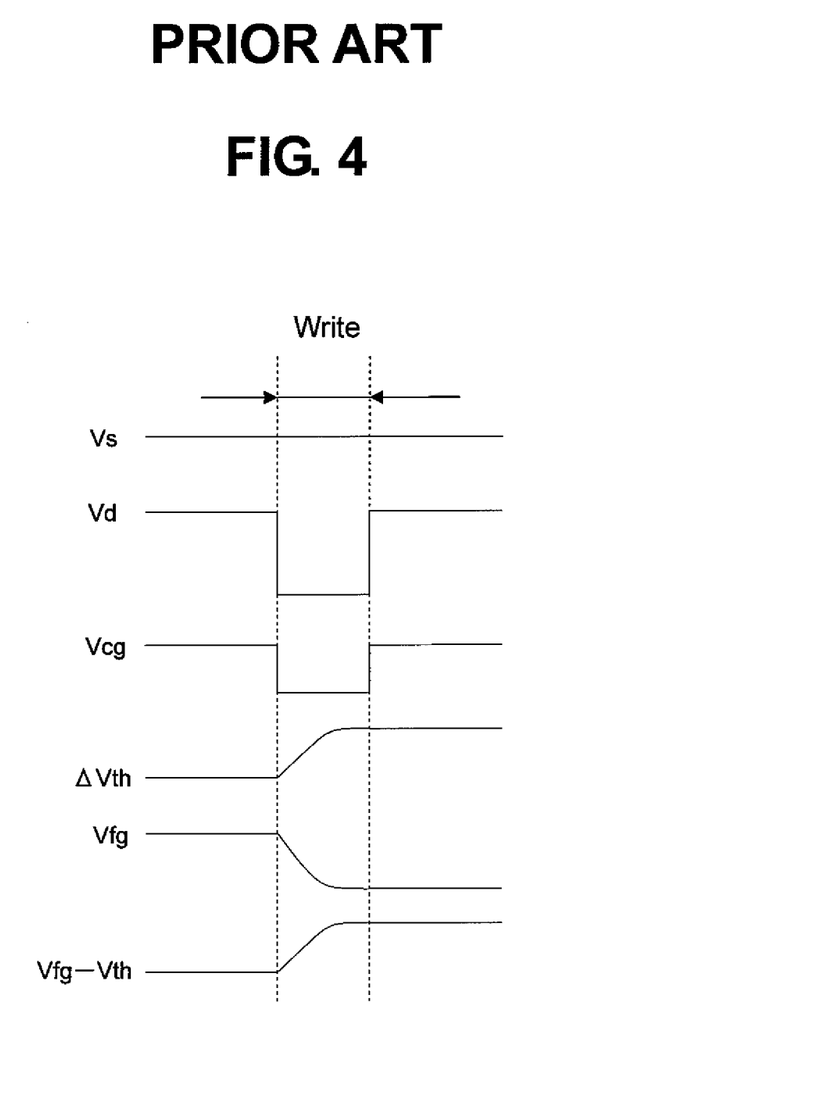
FIG. 4 is a diagram schematically illustrating each potential of the conventional non-volatile EPROM.

FIG. 4 schematically illustrates the state of each of a source potential Vs, a drain potential Vd, a control gate potential Vcg, a floating gate potential Vfg, a threshold voltage variation $\Delta$Vth, and a difference Vfg−Vth(0) between the floating gate potential Vfg and an initial threshold voltage Vth(0) at the time of data writing in the conventional P-channel EPROM.

As illustrated in FIG. 4, the threshold voltage variation $\Delta$Vth caused by writing tends to be less written and saturated with time.

The reason is described below. In the case of a P-channel non-volatile EPROM, the floating gate potential Vfg decreases when hot electrons are injected into the floating gate in writing, and thus the threshold to be monitored fluctuates. When the capacitance of a capacitor formed by the gate oxide film 15 is represented by C1, the capacitance of a capacitor formed by the second insulating film 17 is represented by C2, and the quantity of electric charge of the injected hot electrons is represented by Q, the potential of the floating gate is expressed by expression 1 below.

$$Vfg = \frac{C1}{C1+C2} Vcg + \frac{Q}{C1+C2} \quad \text{(Ex. 1)}$$

Figure 5:
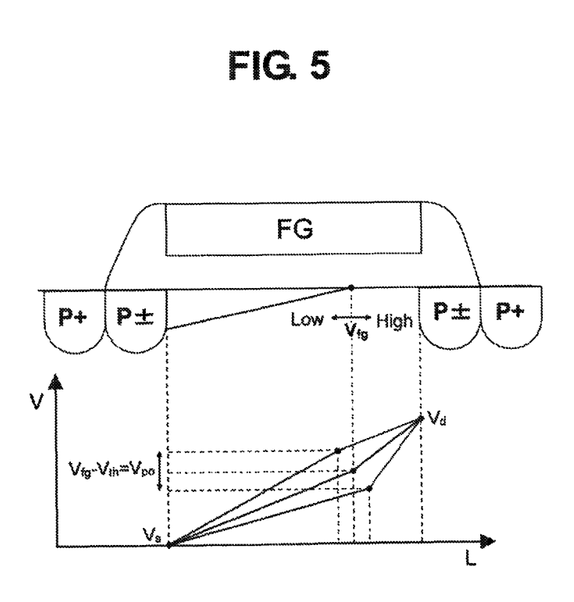
FIG. 5 is a graph schematically showing the dependence of DAHEs on a floating gate.

In the expression 1 above, it is understood that Q<0 is established because hot electrons are injected into the floating gate in writing and hence the potential of the floating gate decreases in writing. Next, FIG. 5 schematically shows the dependence of DAHEs on the floating gate potential Vfg. DAHEs, which are used for writing in a P-channel EPROM, are generated by avalanche breakdown caused by an electric field between a pinch-off point and the drain at the time of saturated operation. The amount of generated DAHEs therefore depends on the electric field between the pinch-off point and the drain. When the initial threshold voltage Vth(0), the control gate potential Vcg, and the drain voltage Vd are constant, as shown in FIG. 5, the electric field between the pinch-off point and the drain becomes larger as the floating gate potential Vfg becomes closer to the initial threshold voltage Vth(0), and hence the amount of generated DAHEs becomes larger. However, as illustrated in FIG. 4, the floating gate potential Vfg decreases with time to increase the difference Vfg−Vth(0) between the floating gate potential Vfg and the initial threshold voltage Vth(0). When the difference Vfg−

Vth(0) increases, the pinch-off point moves in a direction of weakening the electric field between the pinch-off point and the drain as shown in FIG. 5. Thus, the amount of generated DAHEs becomes smaller to deteriorate write characteristics.

Because of the above-mentioned reason, the amount of generated DAHEs becomes smaller with time, and the amount of writing is saturated.

At present, one of the problems inherent in the conventional non-volatile EPROM is erroneous writing, where data is rewritten because the threshold fluctuates when reading is repeatedly performed.

One method for preventing rewriting of data caused by such erroneous writing is a method for preventing rewriting of data by setting a deep threshold before writing so as to enlarge a memory window. In the case of preventing rewriting of data by this method, it is necessary to increase the amount of writing in order to enlarge the memory window. In the conventional non-volatile EPROM, however, the amount of writing decreases with time because of the above-mentioned reason. Thus, it has been demanded to increase the amount of writing.

Figure 6:
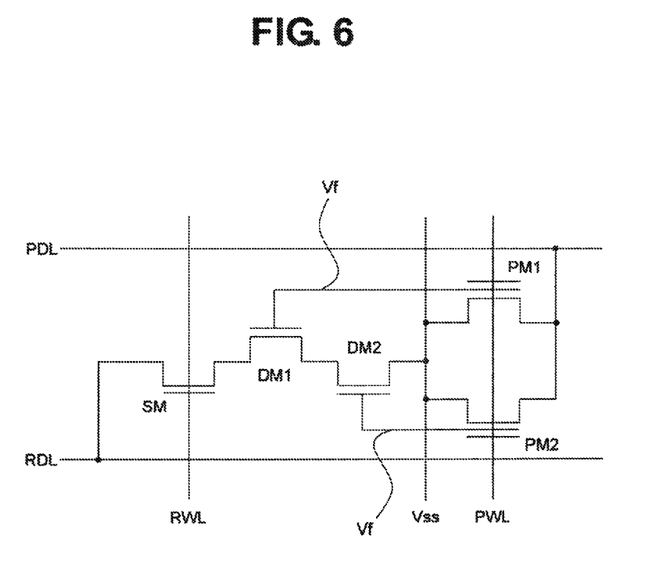
FIG. 6 is a schematic diagram illustrating the outline of the invention described in Japanese Published Patent Application 2001-257324.

Further, Japanese Patent Application Laid-open No. 2001-257324 proposes a method of preventing rewriting of data caused by erroneous writing without increasing the amount of writing. FIG. 6 is a schematic diagram illustrating the outline of the invention described in Japanese Published Patent Application 2001-257324. In Japanese Published Patent Application 2001-257324, a semiconductor integrated circuit includes non-volatile memories (PM1 and PM2 of FIG. 6) having different threshold voltages, and two read transistors (DM1 and DM2 of FIG. 6) whose gate voltages correspond to respective floating gates of the two non-volatile memories and which are designed to detect the switch state based on the state of electric charges of the non-volatile memories. The use of the two read transistors can prevent a current from flowing through the non-volatile memories in reading, to thereby prevent rewriting of data caused by erroneous writing.

Each memory cell, however, needs to have two non-volatile semiconductor memories having different thresholds as well as two read transistors in Japanese Published Patent Application 2001-257324 although the method can prevent the threshold fluctuation caused by erroneous writing. The area of the memory cell thus becomes larger, which is disadvantageous in terms of cost. Accordingly it is beneficial to provide a non-volatile semiconductor memory device capable of improving the amount of writing as a method for preventing rewriting of data caused by erroneous writing without the need of a complicated memory cell.

SUMMARY OF THE INVENTION

It is therefore an object of the present invention to provide a non-volatile semiconductor memory device capable of improving write characteristics without the need of a complicated memory cell.

In order to achieve the above-mentioned object, the present invention uses the following measures.

In a P-channel non-volatile semiconductor memory device, a resistive element is formed and connected to a control gate. A delay effect of the resistive element connected to the control gate is utilized to increase a potential of the control gate so as to cancel out a decrease in floating gate potential caused by hot electrons injected by writing. This can prevent the weakening of an electric field between a pinch-off point and a drain, which leads to a decrease in amount of generated DAHEs in writing. Thus, write characteristics can be improved.

According to the present invention, in the P-channel non-volatile semiconductor memory device, the resistive element is connected to the control gate, and hence the decrease in amount of generated hot carriers in writing can be prevented. Thus, a P-channel non-volatile semiconductor memory device capable of improving write characteristics can be provided.

DETAILED DESCRIPTION OF THE PREFERRED EMBODIMENT

Now, an embodiment of the present invention is described in detail below.

Figure 1:
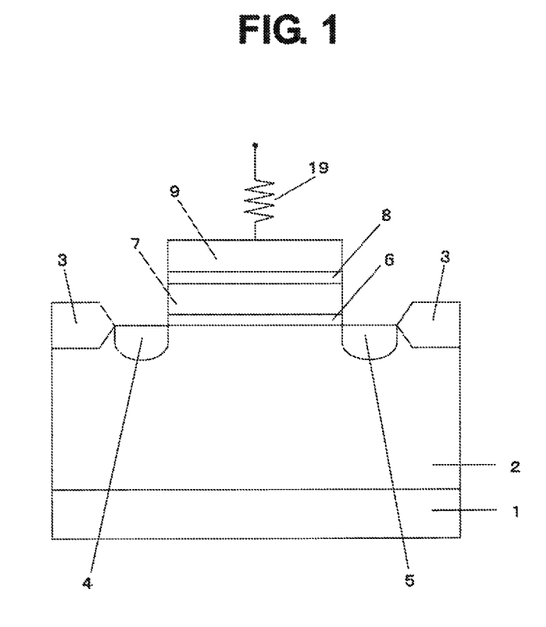
FIG. 1 is a cross-sectional view illustrating a schematic structure of a non-volatile semiconductor memory device according to an embodiment of the present invention.

FIG. 1 is a cross-sectional view illustrating a structure of a non-volatile semiconductor memory device according to the embodiment of the present invention.

As illustrated in FIG. 1, a well 2 of a second conductivity type is formed along one principal surface of a substrate 1 of a first conductivity type in which element isolation regions 3 are selectively formed. Impurities of the first conductivity type are heavily diffused in the well 2, thereby forming a source region 4 and a drain region 5. Through the intermediation of a gate oxide film 6, a floating gate 7 is formed above the substrate in which the source region 4 and the drain region 5 are formed.

A control gate 9 is formed through the intermediation of a second insulating film 8 formed on the floating gate 7. The control gate 9 is connected to a resistive element 19, thereby constituting a non-volatile semiconductor memory device according to the embodiment of the present invention. The resistive element is an element to be used in a general semiconductor device. A diffused resistor or a polycrystalline silicon resistor is typically used.

In this embodiment, a P-channel non-volatile semiconductor memory device including the stacked floating gate and control gate has been exemplified. However, a similar effect can be obtained as long as a non-volatile semiconductor memory device includes a control gate and a floating gate which are capacitively coupled to each other and the control gate can control the potential of the floating gate through the intermediation of the capacitor.

In this embodiment, the resistive element 19 is connected to the control gate 9. In this embodiment, a delay effect of the resistive element connected to the control gate 9 is utilized to improve write characteristics.

The reason is described below.

FIG. 5 is a graph schematically showing the dependence of DAHEs on the floating gate potential Vfg. DAHEs, which are used for writing in a P-channel non-volatile semiconductor memory device, are generated by avalanche breakdown caused by an electric field between a pinch-off point and the drain at the time of saturated operation. At an initial threshold voltage Vth(0), a control gate potential Vcg, and a drain voltage Vd are constant, as shown in FIG. 5, the electric field between a pinch-off point and the drain becomes larger as the floating gate potential Vfg becomes closer to the initial threshold voltage Vth(0), and hence the amount of generated DAHEs becomes larger.

However, it is understood from the following expression representing the potential of the floating gate (expression 1, repeated below as expression 2) that Q<0 is established because hot electrons are injected into the floating gate in writing and hence the potential of the floating gate decreases in writing.

$$Vfg = \frac{C1}{C1+C2}Vcg + \frac{Q}{C1+C2} \quad \text{(Ex. 2)}$$

In the expression, C1 represents the capacitance of a capacitor formed by the gate oxide film 6, C2 represents the capacitance of a capacitor formed by the second insulating film 8, and Q represents the quantity of electric charge of the injected hot electrons.

In the conventional P-channel non-volatile semiconductor memory device, the difference Vfg−Vth(0) becomes larger with the decrease in floating gate potential Vfg, and the amount of generated DAHEs decreases.

As a countermeasure, in this embodiment, the delay effect of the resistive element connected to the control gate is utilized to increase the potential of the control gate so as to cancel out the decrease in floating gate potential caused by the hot electrons injected by writing expressed by Expression 2 above.

Figure 2:
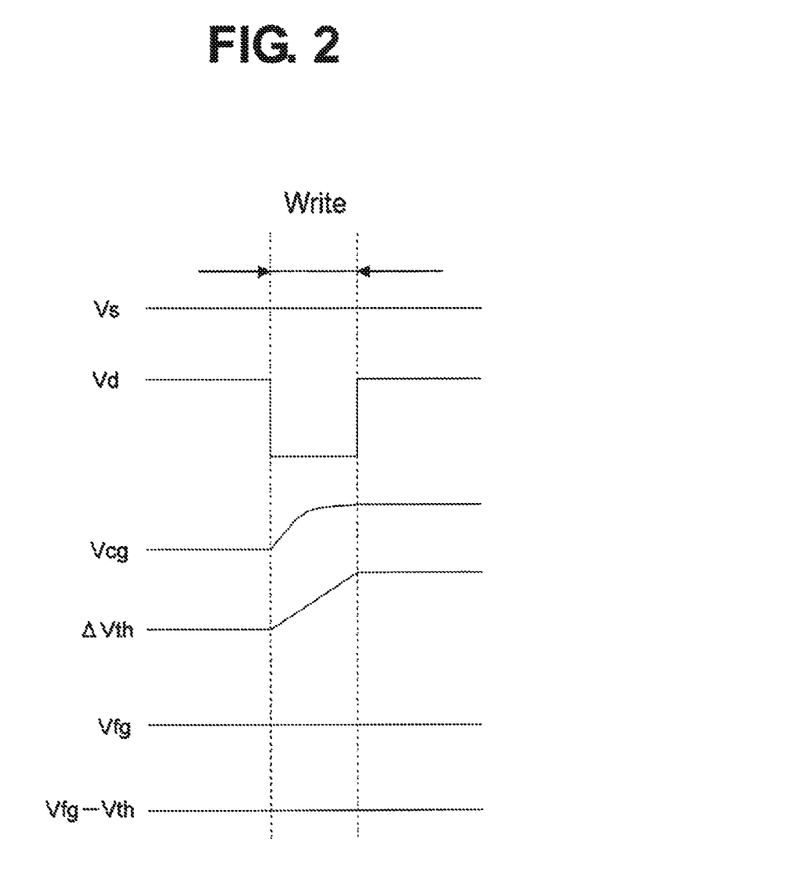
FIG. 2 is a diagram schematically illustrating each potential of the non-volatile semiconductor memory device according to the embodiment of the present invention.

FIG. 2 schematically illustrates the state of each of the source potential Vs, the drain potential Vd, the control gate potential Vcg, the floating gate potential Vfg, the threshold voltage variation ΔVth, the difference Vfg−Vth(0) between the floating gate potential Vfg and the initial threshold voltage Vth(0) at the time of data writing in the P-channel non-volatile semiconductor memory device according to this embodiment.

With the serial connection of the resistive element, the potential of the control gate can be increased as illustrated in FIG. 2 so that the difference Vfg−Vth(0) in writing may be constant. This can prevent the weakening of the electric field between the pinch-off point and the drain, which is responsible for the decrease in amount of generated DAHEs. Thus, the write characteristics can be improved.

According to the embodiment of the present invention described above, the following effect can be obtained.

According to the present invention, in the P-channel non-volatile semiconductor memory device, the delay effect of the resistive element connected to the control gate is utilized to increase the potential of the control gate so as to cancel out the decrease in floating gate potential caused by hot electrons injected by writing. This can prevent the weakening of the electric field between the pinch-off point and the drain, which leads to the decrease in amount of generated DAHEs in writing. Thus, the write characteristics can be improved. Using those measures, it is possible to provide a P-channel semiconductor memory device capable of improving write characteristics without the need of a complicated memory cell.

What is claimed is:

1. A non-volatile semiconductor memory device, comprising:
   a semiconductor substrate;
   an element isolation region disposed in a surface of the semiconductor substrate;
   an N-type well region disposed along one principal surface of the semiconductor substrate;
   a P-type source region and a P-type drain region both arranged in the N-type well region;
   a gate oxide film arranged on the surface of the semiconductor substrate between the P-type source region and the P-type drain region;
   a floating gate disposed on the gate oxide film;
   an insulating film disposed on a surface of the floating gate;
   a control gate capacitively coupled to the floating gate disposed through intermediation of the insulating film; and
   a resistive element serially connected to the control gate and having one end connected only to the control gate, a delay effect of the resistive element being utilized to increase a potential of the control gate so as to cancel out a decrease in floating gate potential caused by hot electrons injected in a writing operation.

2. A non-volatile semiconductor memory device according to claim 1, wherein the resistive element connected to the control gate is used to generate a constant potential difference between a potential of the floating gate and a threshold potential of the non-volatile semiconductor memory device in the writing operation.

3. A non-volatile semiconductor memory device according to claim 1, wherein the resistive element comprises a diffused resistor.

4. A non-volatile semiconductor memory device according to claim 1, wherein the resistive element comprises a polycrystalline silicon resistor.

5. A non-volatile semiconductor memory device comprising:
   a semiconductor substrate;
   an element isolation region disposed in a surface of the semiconductor substrate;
   a well region disposed along one principal surface of the semiconductor substrate;
   a source region and a drain region both arranged in the well region;
   a gate oxide film arranged on the surface of the semiconductor substrate between the source region and the drain region;
   a floating gate disposed on the gate oxide film;
   an insulating film disposed on a surface of the floating gate;
   a control gate capacitively coupled to the floating gate disposed through intermediation of the insulating film; and
   a resistive element serially connected to the control gate so that a delay effect of the resistive element increases a potential of the control gate and cancels out a decrease in a potential of the floating gate resulting from hot electrons injected in the floating gate during a write operation of the non-volatile semiconductor memory device, the resistive element having an end connected only to the control gate and another end connected to a variable voltage source.

6. A non-volatile semiconductor memory device according to claim 5, wherein the resistive element is configured to generate a constant potential difference between the potential of the floating gate and a threshold potential of the non-volatile semiconductor memory device during the write operation.

7. A non-volatile semiconductor memory device according to claim 5, wherein the resistive element comprises a diffused resistor.

8. A non-volatile semiconductor memory device according to claim 5, wherein the resistive element comprises a polycrystalline silicon resistor.

9. A non-volatile semiconductor memory device comprising:
a semiconductor substrate;
an element isolation region disposed in a surface of the semiconductor substrate;
a well region disposed along one principal surface of the semiconductor substrate;
a source region and a drain region both arranged in the well region;
a gate oxide film arranged on the surface of the semiconductor substrate between the source region and the drain region;
a floating gate disposed on the gate oxide film;
an insulating film disposed on a surface of the floating gate;
a control gate capacitively coupled to the floating gate disposed through intermediation of the insulating film; and
a resistive element serially connected to the control gate for increasing a potential of the control gate due to a delay effect of the resistive element so as to cancel out a decrease in a potential of the floating gate caused by drain avalanche hot electrons (DAHEs) injected in the floating gate during a write operation of the non-volatile semiconductor memory device, thereby preventing weakening of an electric field between a pinch-off point and the drain of the non-volatile semiconductor memory device which leads to a decrease in an amount of DAHEs generated during the write operation, the resistive element having an end connected only to the control gate.

10. A non-volatile semiconductor memory device according to claim 9, wherein the resistive element is configured to generate a constant potential difference between the potential of the floating gate and a threshold potential of the non-volatile semiconductor memory device during the write operation.

11. A non-volatile semiconductor memory device according to claim 9, wherein the resistive element comprises a diffused resistor.

12. A non-volatile semiconductor memory device according to claim 9, wherein the resistive element comprises a polycrystalline silicon resistor.

13. A non-volatile semiconductor memory device according to claim 1, wherein another end of the resistive element is connected to a variable voltage source.

14. A non-volatile semiconductor memory device according to claim 9, wherein another end of the resistive element is connected to a variable voltage source.

* * * * *